United States Patent [19]

Retter

[11] 4,330,823
[45] May 18, 1982

[54] HIGH SPEED COMPACT DIGITAL COMPUTER SYSTEM WITH SEGMENTALLY STORED MICROINSTRUCTIONS

[75] Inventor: Charles T. Retter, Framingham, Mass.

[73] Assignee: Data General Corporation, Westboro, Mass.

[21] Appl. No.: 967,041

[22] Filed: Dec. 6, 1978

[51] Int. Cl.³ .............................................. G06F 9/22
[52] U.S. Cl. .................................................. 364/200
[58] Field of Search ... 364/200 MS File, 900 MS File

[56] References Cited

U.S. PATENT DOCUMENTS

| | | | |
|---|---|---|---|
| 3,585,600 | 6/1971 | Saltini | 364/200 |
| 3,599,176 | 8/1971 | Cordero, Jr. et al. | 364/200 |
| 3,634,883 | 1/1972 | Kreidermacher | 364/200 |
| 3,636,522 | 1/1972 | Buschmann et al. | 364/200 |
| 3,778,775 | 12/1973 | Haring et al. | 364/900 |
| 3,930,236 | 12/1975 | Ferguson et al. | 364/200 |
| 3,958,221 | 5/1976 | Serra et al. | 364/200 |
| 3,990,054 | 11/1976 | Perlowski | 364/200 |
| 3,991,404 | 11/1976 | Brioschi et al. | 364/200 |
| 4,037,202 | 7/1977 | Terzian | 364/200 |
| 4,050,058 | 9/1977 | Garlic | 364/200 |
| 4,075,687 | 2/1978 | Nissen et al. | 364/200 |
| 4,131,943 | 12/1978 | Shiraogawa | 364/200 |

*Primary Examiner*—Harvey E. Springborn
*Attorney, Agent, or Firm*—Gary D. Clapp; Joel Wall

[57] ABSTRACT

A computer system architecture includes a processor for processing data, a memory for storing at least macroinstructions for use by the processor, microinstruction logic for storing and providing sequences of frequently used microinstructions, and busses for transmitting at least macroinstructions between the processor and memory. Microinstruction memory circuitry stores microinstructions in segmented form in available microinstruction memory space. Microinstruction segment by segment selection circuitry effects the selection of successive microinstructions of sequences of microinstructions.

5 Claims, 9 Drawing Figures

HIGH SPEED COMPACT DIGITAL COMPUTER SYSTEM WITH SEGMENTALLY STORED MICROINSTRUCTIONS

BACKGROUND OF THE INVENTION

1. Cross Reference to Related Applications

The present application is related, in part, to U.S. patent application Ser. No. 959,038, High Speed Digital Computer System, filed Nov. 8, 1978 and incorporated herein by reference. The present application is the parent application of divisional U.S. patent applications Ser. No. 91,318 and Ser. No. 91,022, both filed on Nov. 5, 1979.

2. Field of the Invention

This invention relates to architecture for a high speed, compact digital computer system and, more particularly, to circuitry used therein to enhance operating speed and efficiency of such a system.

3. Description of Prior Art

Basic elements of a digital computer include a processor, for processing machine language digital data, and a memory. In general, machine language instructions for controlling processing operations of the processor are stored in memory. Memory may also contain at least portions of data to be processed. Instructions and data are transmitted between processor and memory by processor output and memory output busses. Frequently used sequences of instructions, referred to as microinstruction sequences, are stored in a separate microinstruction memory. Certain instructions, referred to as macroinstructions, cause microinstruction memory to provide a corresponding sequence of microinstructions to the processor. A computer further includes input/output (I/O) apparatus for transmitting instructions and data between computer and external devices. External devices may include, e.g., a control console or a tape storage unit.

Capability of such a digital computer is defined, and limited, by its speed and efficiency in processing data and executing instructions. In general, efficient use of available physical hardware space is required to provide maximum computer capability. Computer system capability and hardware efficiency are particularly important in several areas. Among these areas are computer microinstruction memory; circuitry for selecting successive microinstructions of microinstruction sequences; circuitry for periodically refreshing computer memory; and instruction prefetch circuitry for fetching a next instruction to be executed from computer memory while a current instruction is being executed.

Physical hardware space required by microinstruction memory is determined by the efficiency with which microinstructions are stored therein. Microinstructions organization is determined by computer function while microinstruction memory physical structure is determined by currently available hardware. E.g. a microinstruction set may comprise two or more separate pages of microinstructions; each page containing 256 48-bit microinstructions. Presently available read only memories (ROMs) for storing microinstructions may be structured as 512 word long by 8-bit wide memories. A single page of microinstructions could be implemented with six 512 word by 8-bit ROMs. Storage efficiency, however, would be only 50 percent; microinstruction memory would require twice the physical space required to store an equivalent number of bits.

Another limitation of computer capability is time required to select successive microinstructions of a sequence. Circuitry required for such selection should therefore require minimum hardware implementation, and delay, to provide maximum speed of selection.

The present invention provides computer system improvements which bear upon the above noted computer capability/hardware efficiency factors, thus improving speed and efficiency of operation of the system, and also provides a solution for the aforemention problems and limitations of prior art as will be discussed in detail herein below.

SUMMARY OF THE INVENTION

The present invention relates to computer system architecture providing increased computer capability and hardware efficiency. The architecture includes a processor for processing machine language data, a memory for storing at least machine language instructions for use by processor, microinstruction logic for storing and providing sequences of frequently used instructions, and busses for transmitting at least instructions between processor and memory. The architecture includes circuitry to enhance computer system capability and efficiency. Among these are a microinstruction memory providing efficient use of available microinstruction memory space. Another feature is microinstruction selection circuitry for high speed selection of successive microinstructions of a sequence.

It is thus advantageous to incorporate the present invention into a computer system because system capability and efficiency is increased. The present invention is further advantageous because microinstructions are more efficiently stored in microinstruction memory. Additionally, the present invention increases speed with which successive microinstructions may be selected and executed.

It is thus an object of the present invention to provide an improved computer system.

It is another object of the present invention to provide an improved computer microinstruction memory capable of efficient storage of microinstructions.

It is yet another object of the present invention to provide microinstruction selection circuitry increasing speed with which successive microinstructions may be selected and implemented.

Other objects and advantages of the present invention will be understood by those of ordinary skill in the art, after referring to detailed description of preferred embodiments and drawings wherein:

DESCRIPTION OF THE PREFERRED EMBODIMENT

Figure 1:
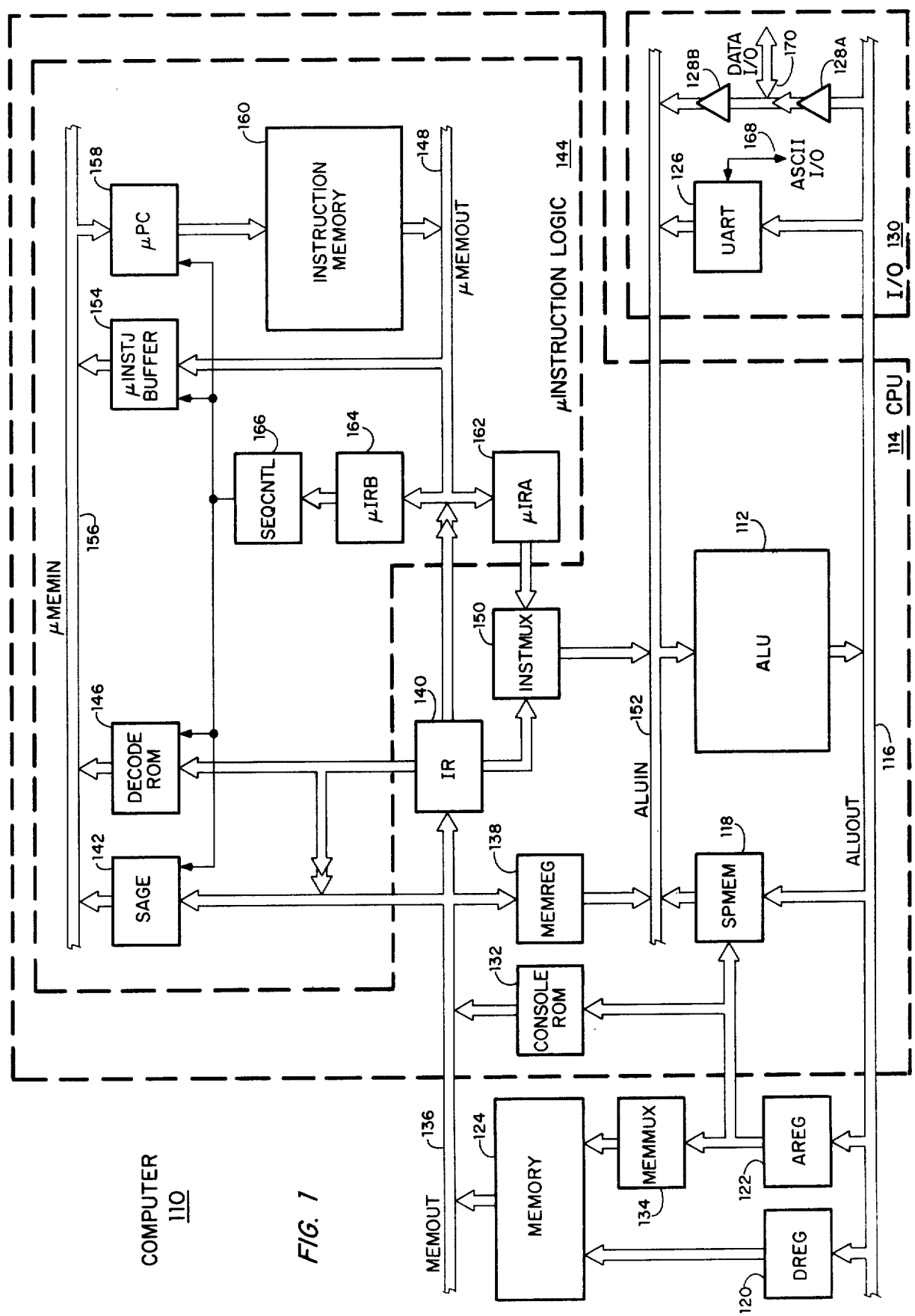
FIG. 1 is a detailed block diagram of a computer incorporating the present invention.

The following discussion presents architecture and operation of a computer incorporating the present invention. Architecture and operation of the present computer will be described first on a block diagram level. Next, selected portions of the present computer, e.g., microinstruction memory circuitry, memory refresh circuitry, and instruction prefetch circuitry will be described individually, in that order. Finally, certain features of the present invention will be summarized.

Certain conventions are used throughout the following discussion to enhance clarity of presentation. Where related circuitry is shown in two or more figures, the figures will share a common figure number with a letter designature, e.g., FIG. 2, 2A. Common electrical points between such circuitry will be indicated by a bracket enclosing a lead to such a point and a designation "A-b"; "A" indicates other figures having the same common point and "b" is a letter designation applied to a particular common electrical point. Reference numbers will comprise a two-digit number (00-99) preceded by the number of the figure in which they appear, e.g., 100 through 199 in FIG. 1, or 400 through 499 in FIG. 4. In the case of related circuitry shown in two or more figures, the figure number used will be that of first figure of the related group. Reference numbers will be assigned in sequence through the related group of figures.

Detailed structure and operation of circuitry presented in the present application will be described only where necessary to illustrate operation. Conventional circuit symbols are used throughout, and structure and operation of circuitry will be understood by one ordinarily skilled in the art. Only those components necessary to illustrate operation of circuitry will be designated by a reference numeral. All components drawn in the same manner as those referenced are to be considered identical to, and operating in the same manner as, those referenced.

1. Computer Architecture and Operation (FIG. 1)

A. Structure

Referring to FIG. 1, there is a disclosed a detailed block diagram of computer 110, whose architecture incorporates the present invention. Major elements of computer 110 are central processing unit (CPU) 114, including microinstruction logic 144, memory 124, and input/output (I/O) interface circuitry 130.

Arithmetic and logic unit (ALU) 112 output in central processing unit (CPU) 114 is connected to ALU output (ALUOUT) bus 116. ALUOUT bus 116 is connected to scratch pad memory (SPMEM) 118 data input in CPU 114, and to inputs of data register (DREG) 120 and address register (AREG) 122 of memory 124. ALUOUT bus 116 is connected to inputs of universal asynchronous receiver/transmitter (UART) 126 and data input/output (DI/O) buffer 128A in I/O interface circuitry 130.

AREG 122 output is connected to address inputs of SPMEM 118 and Console Read Only Memory (ROM) 132 in CPU 114, and to memory multiplexer (MEMMUX) 134 input. Outputs of DREG 120 and MEMMUX 134 are connected to, respectively, data and address inputs of memory 124. Memory 124 output is connected to memory output (MEMOUT) bus 136. Console ROM 132 output is also connected to MEMOUT bus 136. MEMOUT bus 136 is connected to inputs of MEMOUT register (MEMREG) 138 and instruction register (IR) 140 in CPU 114. MEMOUT bus 136 is also connected to start address generator (SAGE) circuit 142 in microinstruction logic 144 of CPU 114.

A first output of IR 140 is connected to MEMOUT bus 136, and to Decode ROM 146 address input in microinstruction logic 144. A second IR 140 output is connected to microinstruction memory output (MEMOUT) bus 148 in microinstruction logic 144. A third output is connected to an input of instruction MUX (INSTMUX) 150 in CPU 114. Outputs of INSTMUX 150, MEMREG 138, and SPMEM 118 are connected to ALU input (ALUIN) bus 152. ALUIN bus 152 in turn is connected to ALU 112 input.

In microinstruction logic 144, outputs of SAGE 142, Decode ROM 146, and Microinstruction Jump ($\mu$INSTJ) Buffer 154 are connected to microinstruction memory input ($\mu$MENIN) bus 156. $\mu$MENIN bus 156 is connected to microprogram counter ($\mu$PC) register 158 input. $\mu$PC 158 output is connected to microinstruction memory 160 address input, and microinstruction memory 160 output is connected to $\mu$MEMOUT bus 148. $\mu$MEMOUT bus 148 is connected to inputs of microinstruction register A ($\mu$IRA) 162, microinstruction register B ($\mu$IRB) 164, and $\mu$INSTJ buffer 154. $\mu$IRB 164 outpt is connected to sequence control (SEQCNTL) 166 input. SEQCNTL 166 outputs are connected to control inputs of SAGE 142, Decode ROM 146, $\mu$INSTJ buffer 154, and $\mu$PC 158. $\mu$IRA 162 output is connected to another input of INSTMUX 150.

In I/O interface circuitry 130, ASCII I/O channel 168 is connected between an external ASCII interface device (not shown for clarity of presentation) and UART 126. UART 126 data output is connected to ALUIN bus 152. As previously stated, UART 126 data input is connected from ALUOUT bus 116. Similarly, Data I/O bus 170 is connected from an external data source, (not shown for clarity of presentation) and Data I/O (DI/O) buffer 128B input. DI/O buffer 128B output is connected to ALUIN bus 152. As previously stated, DI/O buffer 128A input is connected from ALUOUT bus 116; DI/O buffer 128A output is connected to Data I/O bus 170.

Computer 110 further includes a main power supply and a battery backup power supply, neither of which is shown for clarity of presentation.

B. Operation

Referring again to FIG. 1, a user's program, e.g., data and macroinstructions, are stored in memory 124 and transferred to CPU 114 through MEMOUT bus 136 upon request by CPU 114. Transfer of data/macroinstructions out of memory 124, and the writing of such into memory 124, are accomplished through ALUOUT bus 116. Memory 124 read and write addresses are provided from ALU 112 through ALUOUT bus 116 and stored in AREG 122. Data/macroinstructions to be written into memory 124 are likewise provided by ALU 112 and are stored in DREG 120. Data/macroinstructions are provided to memory 124 directly from DREG 120. Read/Write addresses from AREG 122 are converted to memory 124 row and column addresses by MEMMUX 134 and provided to memory 124.

Data/macroinstructions appearing on MEMOUT bus 136 may be transferred through MEMREG 138 to ALUIN bus 152 for use by ALU 112. In general, macroinstructions appearing on MEMOUT bus 136 are transferred into IR 140. Certain macroinstructions e.g., data, may then be transferred from IR 140 to ALU 112 through INSTMUX 150 and ALUIN bus 152. Frequently used sequences of instructions, referred to as microinstructions, are stored in microinstruction logic 144, discussed further below. A macroinstruction corresponding to such a sequence of microinstructions comprises, in part, an instruction to microinstruction logic 144. Microinstruction logic 144 responds to such a macroinstruction appearing in IR 140 by providing the corresponding sequence of microinstructions on μMEMOUT bus 148.

Certain portions of microinstructions, as will be discussed further below, may be transferred into μIRA 162 and to ALUIN bus 152 through INSTMUX 150.

Computer 110, as discussed further below, includes circuitry for providing refresh address to memory 124, to refresh data/macroinstructions stored therein. Refresh circuitry comprises, in part, ALU 112, AREG 122, and MEMMUX 134. Also as discussed further below, CPU 114 includes instruction pre-fetch circuitry. Instruction pre-fetch circuitry allows the next instruction to be executed by CPU 114 to be fetched from memory 124 while a current instruction is being executed.

SPMEM 118 provides temporary storage, e.g., for contents of ALU 112 during an interrupt operation. Data to be stored in SPMEM 118 is provided to SPMEM 118 data input through ALUOUT bus 116. SPMEM 118 read/write addresses are provided from ALU 112 through AREG 122. Data read out of SPMEM 118 appears on ALUIN bus 152, where it is available for use by ALU 112.

Communication between external devices and CPU 114 or memory 124 is provided through I/O interface circuitry 130. Parallel digital words may be transferred through Data I/O bus 170. DI/O buffers 128A and 128B allow, respectively, data/macroinstructions to be transferred between ALUOUT bus 116 or ALUIN bus 152 and Data I/O bus 170. Transfer of data/macroinstructions between Data I/O bus 170 and memory 124 is accomplished through ALU 112.

Serial alphanumeric characters, e.g., in ASCII code, are communicated between CPU 114 and an external device (not shown for clarity of presentation) through ASCII I/O bus 168 and UART 126. As taught in U.S. patent application Ser. No. 959,038, Console ROM 132 is an interface device allowing any external device having, e.g., an ASCII interface, to operate as a computer control console. Console ROM 132 replaces a majority of hard console switches and lights normally used to control computer 110; computer 110 thereby requires only a small hard console. Console ROM 132 contains console program macroinstructions for computer 110 console operation. These include examination and modification of current computer 110 contents, bootstrap loading of programs, and execution of test programs. In operation, predetermined sequences of externally provided alphanumeric characters are received by CPU 114 through UART 126. Received sequences are then provided as address inputs to Console ROM 132 through ALUOUT bus 116 and AREG 122. Corresponding macroinstruction outputs of Console ROM 132 then appear on MEMOUT bus 136 in the same manner as macroinstructions provided from memory 124.

Having described structure and operation of computer 110 on block diagram level, structure and operation of microinstruction logic 144 will next be described in detail.

2. Microinstruction Logic 144 (FIGS. 1, 2, 2A, and 2B)

As described above, microinstruction logic 144 stores frequently used sequences of microinstructions. A macroinstruction corresponding to such a sequence of microinstructions operates, in part, as an instruction to microinstruction logic 144. Microinstruction logic 144 responds by sequentially providing each microinstruction of the corresponding sequence. Microinstructions appear on μMEMOUT bus 148 and, in part, are transferred into μIRA 162 to be provided to ALU 112 through INSTMUX 150. Other portions of microinstructions provide random control signals to CPU 114 and microinstruction logic 144.

Microinstruction logic 144 structure has been previously described in describing computer 110 on block diagram level. The following discussion will begin with a description of microinstruction logic 144 operation on block diagram level. Circuitry used in a presently preferred embodiment of microinstruction logic 144 will then be presented.

A. Microinstruction Logic 144 Operation (FIG. 1)

Referring again to FIG. 1, microinstruction memory 160 stores sequences of microinstructions. Each such sequence corresponds to one or more macroinstructions stored, e.g., in memory 124. Memory 160 may appear to CPU 114 to comprise a 512-word by 48-bit wide memory, containing up to 512 48-bit microinstructions. Memory 160 may be internally organized as a two-page memory, wherein each page may be organized as a 512-word by 24-bit wide memory. A memory 160 page thereby has sufficient bit capacity to store one-half the microinstructions contained in memory 160. Each memory 160 page may be 24 bits wide, i.e., one-half of a microinstruction. Each page may then be 512 words long, i.e., twice the number of microinstructions to be stored therein. Each microinstruction may be divided into a first and a second segment; each segment comprising 24 bits. First and second segments of a single microinstruction may be stored in consecutive word locations of memory 160. E.g., first segment of microinstruction 24 in memory 160 location 48 and second segment in memory 160 location 49. A single microinstruction may then be called from memory 160 in two sequential steps. Access time rate of memory 160 is preferably no more than ½ a CPU 114 cycle period (e.g., 0.2 microseconds). A single microinstruction may therefore be read out of memory 160 within a single CPU 114 cycle. The first segment of a microinstruction is transferred into μIRA 162 and may provide instruction bits and control signals to CPU 114. The second segment of a microinstruction may be transferred into μIRB 164 to provide control signals for selecting successive microinstructions of a microinstruction sequence. It is understood that other organizations of memory 160, μIRA 162 and μIRB 164 may be used. E.g., memory 160 page may be ¼ microinstruction wide and may contain four times as many words as microinstructions to be stored therein. In this case, a single microinstruction would comprise four segments stored in four memory 160 locations. There would be four microinstruction registers. The four segments of a microinstruction would be transferred to corresponding microinstruction registers during a single CPU 114 cycle; memory 160 access time would be less than ¼ CPU 114 cycle period. Further, individual segments of a microinstruction need not be stored in successive memory 160 locations, but, e.g., may be stored in an interleaved fashion. Also, memory 160 may be organized as a single or multiple page memory.

In operation, a macroinstruction corresponding to a particular microinstruction sequence appears on MEMOUT bus 136 and is transferred into IR 140. In general, a macroinstruction in IR 140 is decoded by Decode ROM 146, which provides memory 160 the address of the first microinstruction of the corresponding sequence. As taught in U.S. patent application Ser. No. 959,038, SAGE 142 may directly decode certain macroinstructions to directly provide memory 160 address of the first microinstruction. SAGE 142 thereby eliminates delay time through IR 140 and Decode ROM 146 and reduces time required to initiate execution of certain sequences. IR 140 output to Decode ROM 146 is also connected to SAGE 142 input from MEMOUT bus 136. In the event of an interrupt operation, for example, a current macroinstruction may be stored in IR 140. At the conclusion of the interrupt, the stored macroinstruction may be transferred from IR 140 to MEMOUT bus 136 and SAGE 142 input, for re-initiation of the corresponding microinstruction sequence. This allows a microinstruction sequence to be reinitiated after interruption without requiring a new read cycle from memory 124.

First the memory 160 microinstruction address appears on µMEMIN bus 156 and is transferred into µPC register 158. The address is then provided to the address input of microinstruction memory 160. This address, and all subsequent addresses, selects two memory 160 storage locations containing first and second segments of the corresponding microinstructions. A separate address input, described further below, provides an additional address bit to select between first and second locations, i.e., between first and second segments. The first segment is selected first and transferred through µMEMOUT bus 148 to µIRA 162. The second segment is then selected and transferred through µMEMOUT bus 148 to µIRB 164. In regard to the operation of CPU 114, therefore, microinstruction memory 160 appears to provide in one CPU 114 cycle a 48-bit microinstruction that is 48-bits wide by 512 words long.

Certain bits of first microinstruction segment in µIRA 162 may be provided to ALU 112 through INSTMUX 150 as an instruction word. Other bits of first microinstruction segment may provide random control signals to ALU 112. The IR 140 output to µMEMOUT bus 148 allows certain macroinstruction bits to be used to modify a first (or second) microinstruction segment. In such a case, certain microinstruction bits are "blank" (e.g., default logic 1) and these bits are (e.g., logic 0's) provided from IR 140. The second microinstruction segment in UIRB 164 may be generally used to control the selection of successive microinstructions of the sequence. In this regard, certain bits of a second microinstruction segment may specify a condition to be tested by that microinstruction. Certain other bits provided to SEQCNTL 166 may specify action to be taken, depending upon test results. There may be four possible actions to be taken. First, to go to a microinstruction specified by a memory 160 address provided by SAGE 142. Second, to go to a microinstruction specified by a memory 160 address provided by Decode ROM 146. Third, to jump to a microinstruction at a memory 160 address provided by µINSTJ buffer 154. Fourth, to continue to next successive memory 160 address. First and second actions may be taken, e.g., at a microinstruction sequence branch or to initiate a new microinstruction sequence. Again, SAGE 142 may be used where it is desirable to rapidly initiate a next microinstruction. Third action is a standard jump operation. In this case, a memory 160 address to be jumped to may be specified by second segment bits of a following microinstruction, which are transferred onto µMEMIN bus 156 through µINSTJ buffer 154. Two successive microinstructions are therefore required to execute a jump. A condition to be tested is specified in a second segment of a first microinstruction. The address jumped to is specified in a second segment of a second microinstruction. Jump then occurs at the start of a third successive microinstruction. Fourth action occurs when successive microinstructions are stored in corresponding successive memory 160 locations. In this case, µPC register 158 operates a counter and an address therein is incremented as each microinstruction is executed.

In summary, µPC register 158 address selects successive pairs of memory 160 locations containing first and second segments of microinstructions. Selection of successive microinstructions is performed by SEQCNTL 166, which decodes certain second microinstruction segment bits from µIR B 164. SEQCNTL 166 provides enabling outputs to SAGE 142, Decode ROM 146, µINSTJ buffer 154 and µPC register 158.

Having described microinstruction logic 144 operation on block diagram level, circuitry used in a presently preferred embodiment of microinstruction logic 144 will be presented next.

B. Microinstruction Logic 144 Circuitry (FIGS. 2, 2A, 2B)

Figure 2:
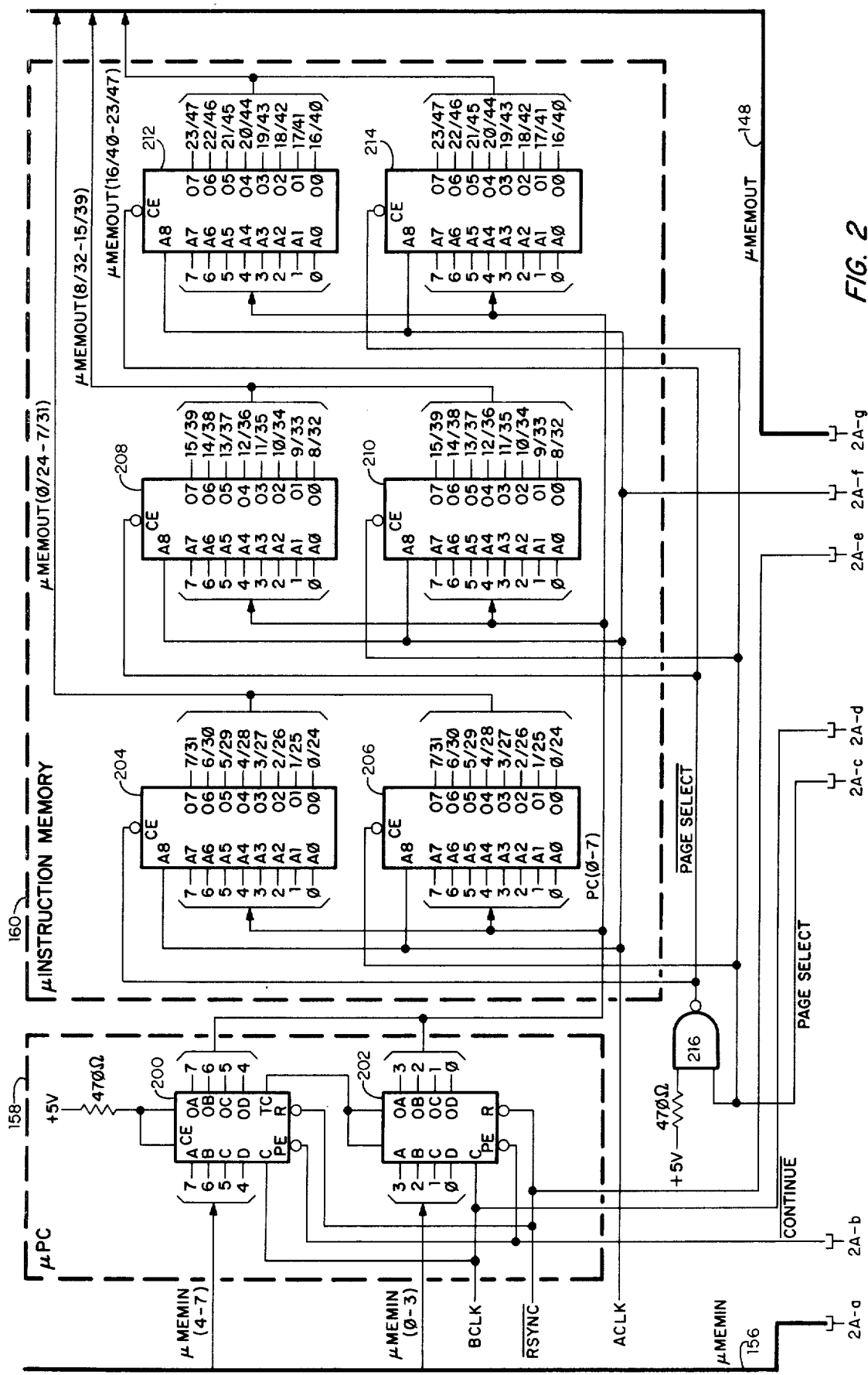
FIG. 2 is a schematic of computer microinstruction memory.
Figure 2A:
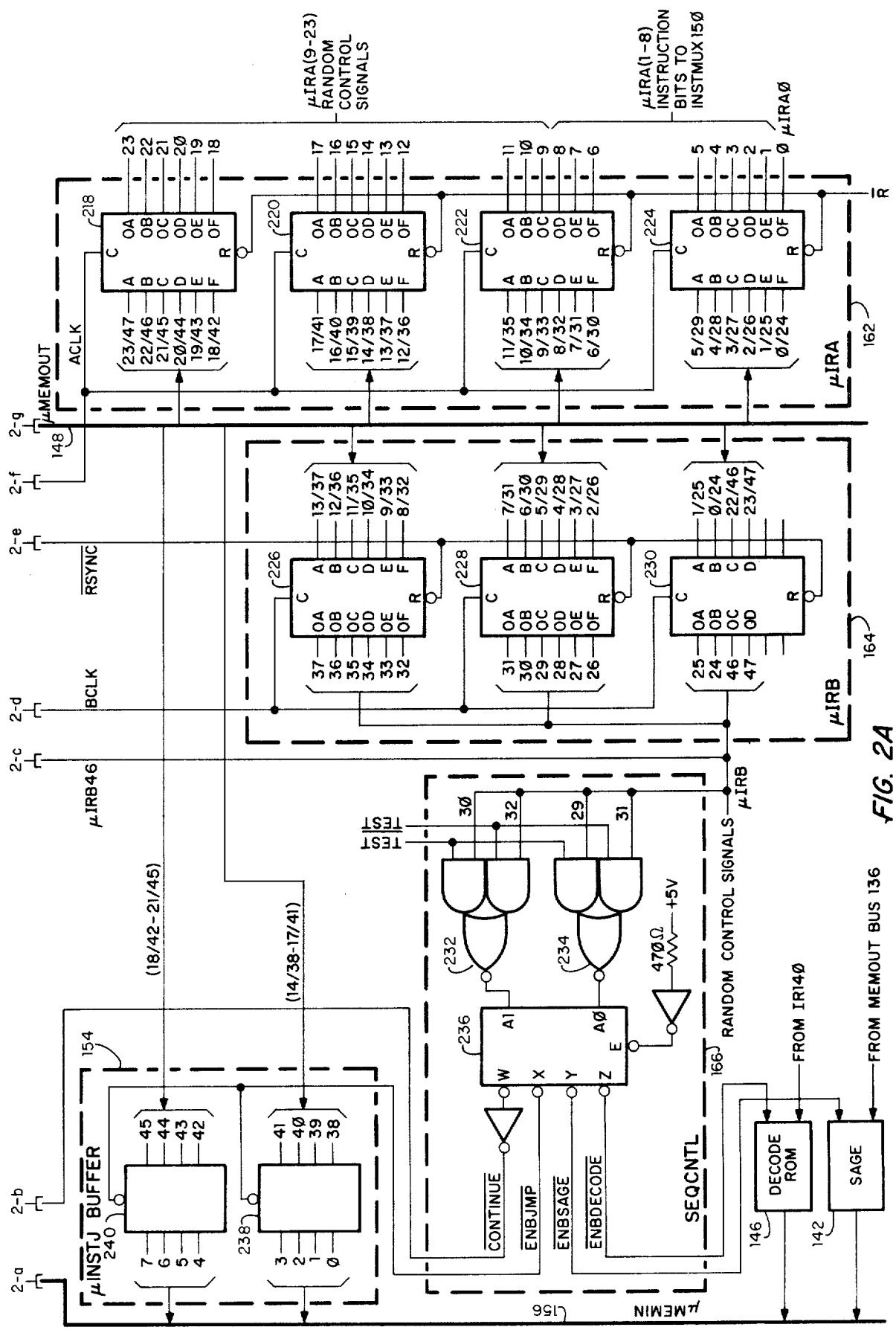
FIG. 2A is a schematic of computer microinstruction logic including sequence control circuitry.
Figure 2B:
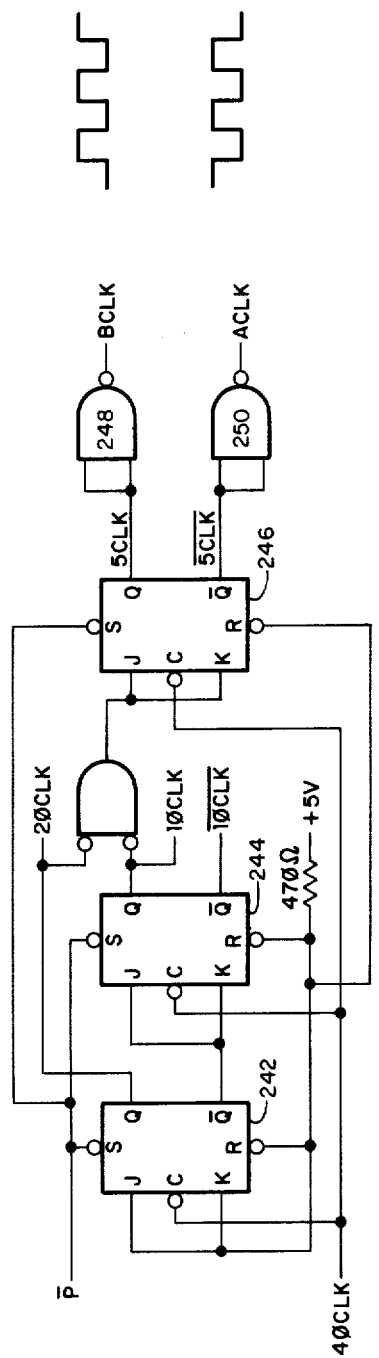
FIG. 2B is a schematic of circuitry generating clock signals for use by microinstruction memory and logic circuitry shown in FIGS. 2 and 2A.

Schematics of circuitry used in a preferred embodiment of microinstruction logic 144 is presented in FIGS. 2 through 2B, and related to block diagram FIG. 1.

Referring to FIG. 2, µPC register 158 and microinstruction memory 160 are shown. µPC register 158 comprises four bit counters 200 and 202, and microinstruction memory 160 comprises read only memories (ROM) 204, 206, 208, 210, 212 and 214.

Counters 200 and 202 data inputs are connected from µMEMIN bus 156 and counters 200 and 202 data outputs are connected to address inputs of ROMs 204 and 214. Counters 200 and 202 parallel count enable inputs are connected to enable signal $\overline{\text{CONTINUE}}$ from SEQCNTL 166, described further below. An address appearing on µNEMIN bus 156 is loaded into counters 200 and 202 by clock signal BCLK when $\overline{\text{CONTINUE}}$ is logic 0. If $\overline{\text{CONTINUE}}$ is logic 1, counters 200 and 202 operate as serial binary counters and an address stored therein is successively incremented by BCLK. As described further below, BCLK is a squarewave clock signal occurring at CPU 114 cycle rate (e.g., 5 MHZ). Counters 200 and 202 reset inputs are connectd to reset signal $\overline{\text{RYSNC}}$, which allows the contents of counters 200 and 202 to be reset to 0.

Turning the microinstruction memory 160, ROMs 204, 208, and 212 comprise page one of memory 160 while ROMs 206, 210 and 214 comprise page two. ROMs 204 and 206 contains bits 0 to 7 and bits 24 to 31 of, respectively, first and second microinstruction segments. Similarly, ROMs 208 and 210 contain bits 8 to 15 and 32 to 39 while ROMs 212 and 214 contain bits 16 to 23 and 40 to 47. Data outputs of ROMs 204 and 206 (µMEMOUT 0/24 to 7/31) are wire ORed and connected to µMEMOUT bus 148. Similarly, data outputs of ROMs 208 and 210 (μMEMOUT 8/32 to 15/39) and ROMs 212 and 214 (μMEMOUT 16/40 to 23/47) are, respectively, wire ORed and connected to μMEMOUT bus 148. Selection between pages one and two of memory 160 is accomplished by the PAGE SELECT from μIRB 164, described further below. PAGE SELECT is connected directly to the enable inputs of ROMs 206, 210, and 214. PAGE SELECT is inverted by gate 216 and $\overline{\text{PAGE SELECT}}$ provided to enable inputs of ROMs 204, 208, and 212.

Considering page one (ROMs 204, 208, and 212) of memory 160, each ROM comprises a 512 word eight bit wide memory. ROMS 204, 208, and 212 thereby comprise a 24-bit wide by 512 word long memory. Page 2 is similar to page 1. Each microinstruction is divided into two 24-bit segments, which are stored in successive locations of page one, i.e., an even address and an odd address. E.g., the first segment of microinstruction 24 is stored in location 24 and second segment stored in location 25. Selection of a single page one address requires nine address bits ($2^9 = 512$). μPC register 158 address outputs comprise the eight most significant bits of memory 160 address. μPC register 158 address output is therefore capable of selecting any single consecutive pair of address locations, i.e., a pair of memory 160 locations containing a single microinstruction. The least significant memory 160 address bit is provided by clock signal ACLK. ACLK selects between consecutive memory 160 locations, i.e., between first and second segments of a microinstruction. As described further below, ACLK is a squarewave clock signal at same frequency as BCLK, but is inverted from BCLK. For first half of a BCLK period, ACLK is logic 0 and, during the second half of the BCLK period, ACLK is logic 1. During a single BCLK period, therefore, ACLK first selects an even address memory 160 location containing a first microinstruction segment (bits 0 to 23). ACLK then selects an odd address memory 160 location containing a second microinstruction segment (bits 24 to 47). First and second microinstruction segments so selected are thereby sequentially transferred from memory 160 to μMEMOUT bus 148 during a single BCLK cycle.

Referring to FIG. 2A, μIRA 162, μIRB 164, SEQCNTL 166, μINSTJ buffer 154, Decode ROM 146, and SAGE 142 are shown. μIRA 162 comprises six bit registers 218, 220, 222 and 224, whose data inputs are connected from μMEMOUT bus 148 (μMEMOUT 0/24 to 23/47). Registers 218, 220, 222, and 224 clock inputs are connected to ACLK. μIRB 164 comprises six bit registers, 226, 228 and to 230, whose data inputs are also connected from μMEMOUT bus 148 (μMEMOUT 0/24 to 13/37, 22/46, 23/47). Registers 226, 228 and 230 clock inputs are connected to BCLK. A first microinstruction segment (μMEMOUT φ to 23) appearing on μMEMOUT bus 148 is thereby loaded into μIRA 162 by ACLK. Bits 1 to 8 of first microinstruction segment (μIRA 1 to 8) are provided from registers 222 and 224 to INSTMUX 150 and ALU 112 as instruction bits. Bit 0 (μIRAφ) from register 224 is provided to INSTMUX 150 as an enable signal indicating μIRA 1 to 8 are to be transferred through INSTUMUX 150 to ALUIN bus 152. Bits 9 to 23 of first microinstruction segment (μIRA 9 to 23) are provided to ALU 112 as random control signals. Registers 218, 220, 222 and 224 reset inputs are connected to reset signal R, which allows contents of μIRA 162 to be reset to 0.

Second microinstruction segment (μMEMOUT 24 to 47) appears on μMEMOUT bus 148 after first microinstruction segment and is transferred into μIRB 164 by BCLK. Registers 226, 228 and 230 reset inputs are connected to $\overline{\text{RYSCN}}$, which allows μIRB 164 contents to be reset to 0.

Second microinstruction segment bits μIRB 24 to 28 and 33 to 27, are used as random control signals. In part, these bits define test conditions, referred to above, for controlling sequential selection of microinstructions. Bits μIRB 29 to 32 are provided to gates 232 and 234 of SEQCNTL 166. These bits select, dependent upon test results, which of four possible actions, described above, is to be taken. Inputs TEST and $\overline{\text{TEST}}$ to gates 232 and 234 are enable signals representing test results. Gates 232 and 234 outputs are provided to decoder 236 inputs. Decoder 236 decodes gate 232 and 234 outputs to provide four enable signal outputs. As described above, $\overline{\text{CONTINUE}}$ is provided to counters 200 and 202 of μPC register 158. $\overline{\text{CONTINUE}}$ determines whether counters 200 and 202 will be parallel loaded with an address from μMEMIN bus 156, or whether an address stored therein is to be incremented. $\overline{\text{ENBJMP}}$ is provided to μINSTJ buffer 154. $\overline{\text{ENBJMP}}$ enables buffers 236 and 238 to transfer second microinstruction segment bits μMEMOUT 38 to 45 of the next microinstruction to μMEMIN bus 156. Second segment bits 38 to 45 of the next microinstruction represent a memory 160 address containing a microinstruction to be jumped to. $\overline{\text{ENBSAGE}}$ and $\overline{\text{ENBDECODE}}$, respectively, enable SAGE 142 and Decode ROM 146.

As stated above, second microinstruction segment bit μIRB 164 is provided to microinstruction memory 160 as selection signal PAGE SELECT. Each microinstruction therefore contains information identifying whether the next successive microinstruction is located on page 1 or page 2 of memory 160.

Referring to FIG. 2B, circuitry for generating ACLK and BCLK is shown. Flip-flops 242, 244 and 246 comprise a divide by eight counter clocked by 40CLK, a 40 MHz clock signal. Flip-flop 246 Q and $\overline{\text{Q}}$ outputs are inverted by gates 248 and 250 to provide symmetric and inverted square wave BCLK and ACLK signals. As stated above, BCLK period is CPU 114 cycle period (5 MHz). ACLK is logic 0 during first half of BCLK period and logic one during second half of BCLK period. $\overline{\text{P}}$ (Preset) to flip-flops 242, 244 and 246 set inputs allow initial starting condition of flip-flops 242 to 246, 244 and be set.

Having described structure and operation of microinstruction logic 144, memory 124 refresh circuitry will be described next.

3. Memory 124 Refresh Circuitry (FIGS. 1, 3, 3A, and 3B)

A. Memory 124 Operation (FIG. 1)

Memory 124 operation will be described first on a block diagram level. Memory 124 operation will then be described with the aid of schematics showing a presently preferred embodiment of memory 124, AREG 122, MEMMUX 134 and CPU 114 memory control circuitry.

Referring to FIG. 1, memory 124 may comprise a 32K word (K = 1024) by 16 bit memory. Memory 124 may be internally organized as two pages, each page containing 128 rows of words by 128 collumns of words. A memory 124 read, write, or refresh cycle period may be 400 nanoseconds. It is understood that other memory 124 architectures, parameters, and periods may be used. E.g., memory 124 may be 24 or 32 bits wide or have different internal organization (256 columns by 128 rows). Similarly, the memory 124 address format may differ from that shown herein.

As previously described, ALU 112 provides refresh addresses to memory 124 during normal operation. Each refresh cycle refreshes an entire row of both pages of memory 124. A refresh address may be stored in an ALU 112 register, and is incremented and provided to memory 124 at predetermined refresh intervals (e.g., 12.8 microseconds).

In the event of a computer 110 main power supply failure, computer 110 battery back-up supply provides power to memory 124 and CPU 114 memory control circuitry, discussed below. Battery backup supply thereby prevents the loss of a user program and data stored in memory 124. When a main power supply failure occurs, the refresh address is transferred from ALU 112 register to address register 122 and stored therein. CPU 114 memory control circuitry continues to control memory 124 refresh. The refresh address in address register 122 is incremented at each refresh interval and provided to memory 124 to refresh successive rows of memory 124.

Figure 3:
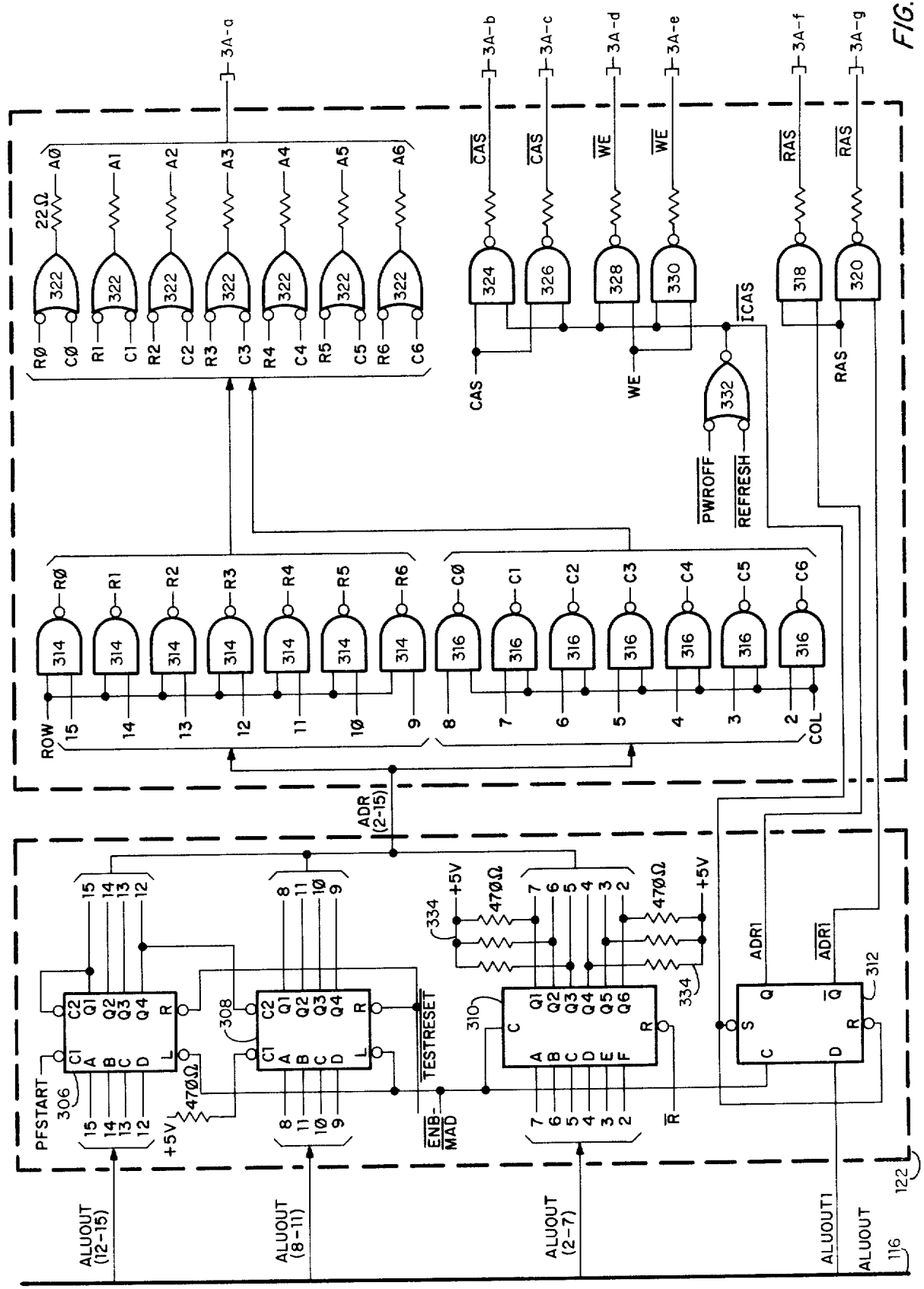
FIG. 3 is a schematic of computer memory address circuitry.

B. Memory 124 Circuitry (FIGS. 3, 3A and 3B)

Schematics of circuitry used in a preferred embodiment of memory 124, AREG 122 and MEMMUX 134, and memory control circuitry are shown in, respectively, FIGS. 3A, 3 and 3B, and will be discussed in that order.

Figure 3A:
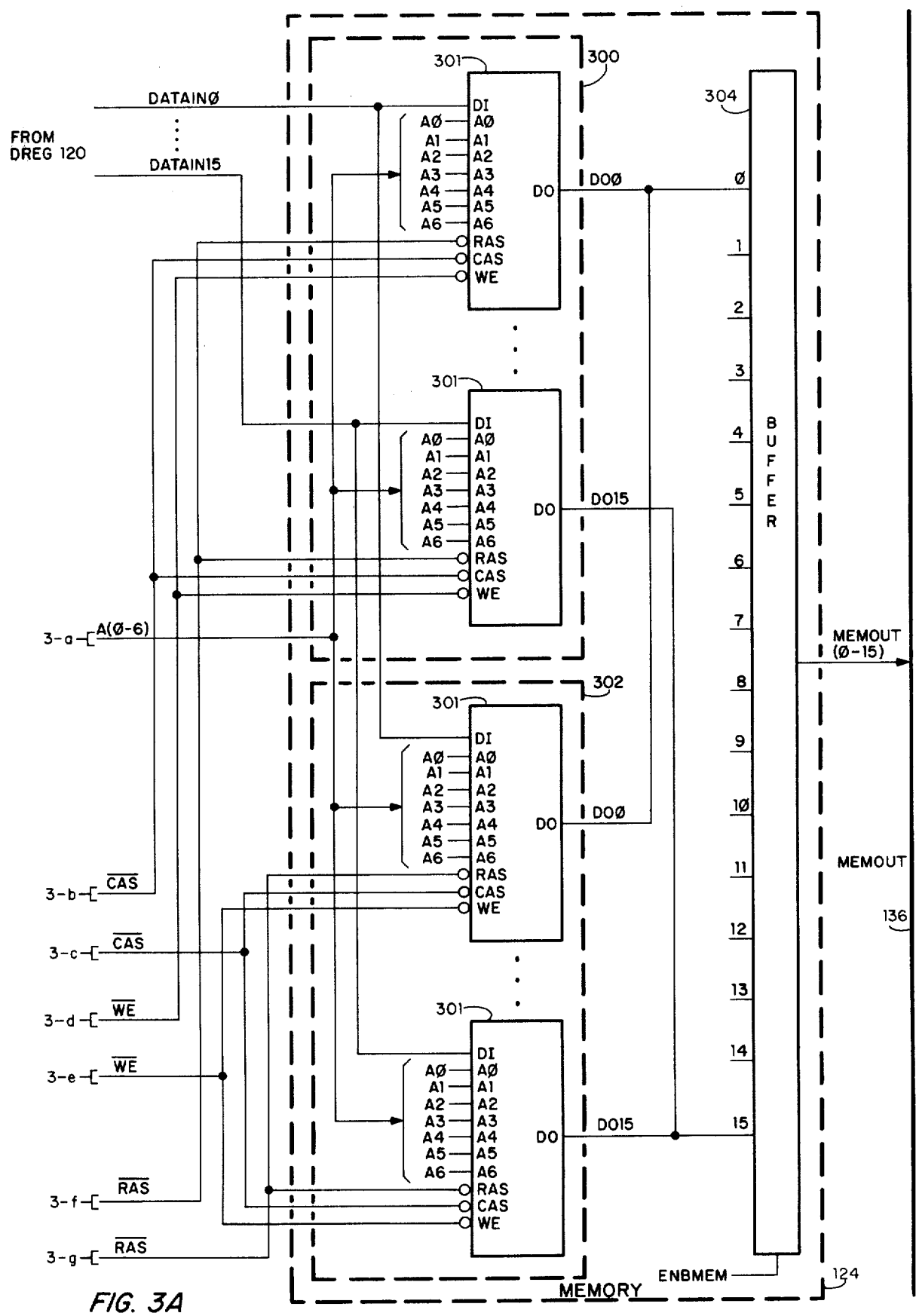
FIG. 3A is a schematic of computer memory.
Figure 3B:
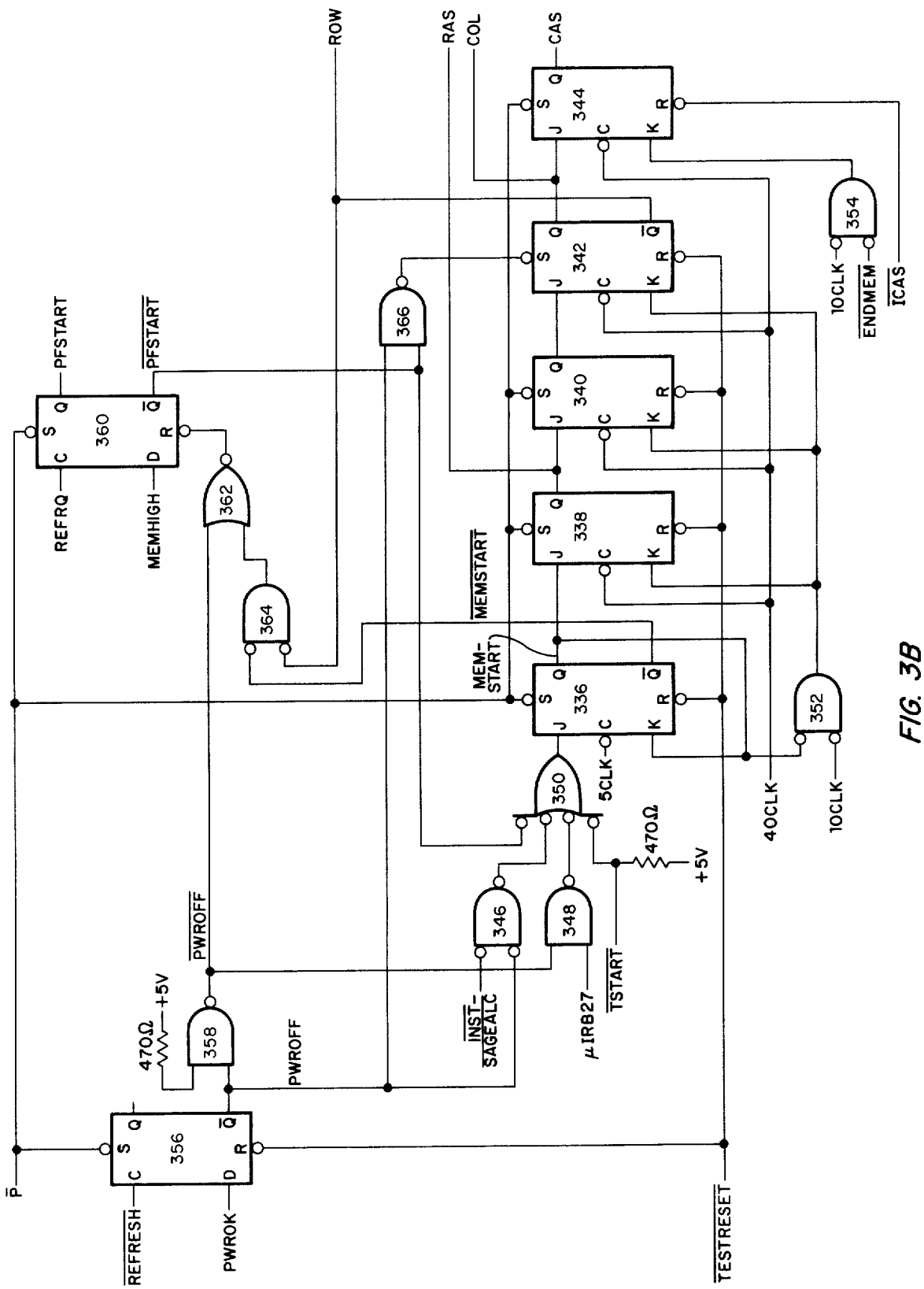
FIG. 3B is a schematic of computer memory control circuitry.

Referring to FIG. 3A, memory 124 comprises two similar banks 300 and 302 of dynamic MOS RAMs (random access memories). Each bank contains one-half of memory 124 storage capacity. Referring to bank 300, bank 300 comprises 16 identical RAMS 301. Each RAM 301 contains a single bit of each word stored in bank 300, and is internally organized as an array of 128 rows by 128 columns.

As taught in co-pending U.S. Pat. application Ser. No. 959,038, memory read and write cycles are performed by providing sequential row and column addresses to bank 300 RAMs. In a read cycle, a seven bit row address is first provided to bank 300 RAM 301 address inputs (A0-A6), accompanied by a row address strobe ($\overline{RAS}$) signal. A seven bit column address is then provided to bank 300 RAM 301 address inputs, accompanied by a column address strobe ($\overline{CAS}$) signal. 16 bits of information, representing the addressed word, then appear at bank 300 RAM 301 outputs (DO0 to DO15). The addressed word is transferred through buffer 304 to MEMOUT bus 136 by buffer 304 enable input ENB-MEM. In a write cycle, a word to be written into memory 124 is provided to bank 300 RAM 301 data inputs from data register 120 (DATAIN 0 to DATAIN 15). Inputs DATAIN0 to DATAIN 15 are accompanied by a write enable ($\overline{WE}$) signal to bank 300 RAM 301 write enable inputs.

Read and write cycles to bank 302 are executed in the same manner as to bank 300. Selection between banks 300 and 302 is accomplished by providing RAS to either bank 300 or bank 302. $\overline{RAS}$ is selectively gated with one bit of memory 124 address from AREG 122. Banks 300 and 302 will both, therefore, receive identical row and column address inputs and $\overline{CAS}$ inputs. Only one of banks 300 or 302 will, however, receive an $\overline{RAS}$ input.

A refresh cycle is similar to a read cycle, except only row address and $\overline{RAS}$ are provided to bank 300 RAMs 301. Refresh is therefore accomplished by executing a partial read operation. Banks 300 and 302 both receive $\overline{RAS}$ inputs when executing a refresh cycle, so that rows of both banks 300 and 302 are refreshed at same time.

Referring to FIG. 3, AREG 122 and MEMMUX 134 are shown. AREG 122 comprises counters 306, 308, register 310, and flip-flop 312. Data inputs of counters 306 and 308, register 310 and flip-flop 312 are connected from ALUOUT bus 116. Address bits ALUOUT 9 to ALUOUT 15 from ALUOUT bus 116 comprise row address bits. Bits ALUOUT 2 to ALUOUT 8 comprise column address bits. Address bit ALUOUT 1 is a bank selection bit for selecting either bank 300 or bank 302.

Counters 306 and 308 each comprise a single flip-flop (A), and a group of three flip-flops (B, C, and D) arranged as a three bit counter. Flip-flop A is connected from data input A, provides output Q1, and is clocked by clock input CLK1. Flip-flops B, C, and D are, respectively, connected from data inputs B, C, and D, provide outputs Q2, Q3, and Q4, and are clocked by input CLK2. Counter 306 flip-flops A to D and counter 308 flipflops B to D are connected as a 7 bit counter clocked by signal PFSTART (Power Failure Start). These seven flip-flops receive row address bits ALU-OUT 9 to 15 and provide row address outputs ADR 9 to 15. Counter 308 flip-flop A and six bit register 310 comprise a seven bit register for receiving column address bits ALUOUT 2 to 8 and providing column address outputs ADR 2 to 8. Flip-flop 312 receives address bit ALUOUT 1 and provides outputs ADR1 and $\overline{ADR1}$ for selectively enabling $\overline{RAS}$ to bank 300 or to bank 302. Reset inputs of counters 306 and 308 and register 310 are provided, respectively, with reset signals $\overline{TESTRESET}$ and R. These reset inputs allow row and column address bits to be reset to 0.

In normal operation, a read, write, or refresh address from ALU 112 is transferred into AREG 122 by load enable signal $\overline{ENBMAD}$ (Enable Memory Address). Row address bits ADR 9 to 15 from counters 306 and 308 are provided to inputs of row address gates 314 in MEMMUX 134. Likewise, column address bits ADR 2 to 8 are provided to inputs of column address gates 316. Bank select bit ADR 1 and $\overline{ADR1}$ are provided to inputs of, respectively, gates 318 and 320. Gates 314 row enable input signal ROW first becomes active to transfer row address bits ADR 9 to 15 through gates 314 (R0-R6) and OR gates 322 (A0-A6) to banks 300 and 302 RAM address inputs. RAS to gates 318 and 320 then occurs. Either bank 300 or bank 302 receives $\overline{RAS}$ input, as determined by gates 318 and 320 enable input signals ADR1 and $\overline{ADR1}$. ROW terminates after RAS occurs, and gate 316 column enable input signal COL becomes active. Column address bits ADR 2 to 8 are transferred through gates 316 (C0-C6) and 322 (A0-A6) to bank 300 and 302 RAM address inputs. CAS to gates 324 and 326 then occurs, and banks 300 and 302 receive $\overline{CAS}$ inputs. Gates 324 and 326 provide separate $\overline{CAS}$ inputs to, respectively, banks 300 and 302 to reduce loading on these gates. COL is terminated after occurrence of CAS, and memory 124 cycle is completed. $\overline{WE}$ is provided to banks 300 and 302 through gates 328 and 330 during a write cycle in same manner as $\overline{CAS}$.

As described above, a refresh cycle during normal operation comprises a partial read cycle. Refresh address stored in an ALU 112 register is transferred onto ALUOUT bus 116. Refresh address, however, comprises only seven bits of Row address information, i.e., ALUOUT 9 to 15. ALUOUT 9 to 15 are transferred into counters 306 and 308 to appear as ADR 9 to 15. Gate 332 concurrently receives input signal $\overline{\text{REFRESH}}$ and provides signal $\overline{\text{ICAS}}$ (Inhibit Column Address Strobe). ICAS inhibits gates 324, 326, 328, and 330, thereby inhibiting $\overline{\text{CAS}}$ and $\overline{\text{WE}}$ to banks 300 and 302 of memory 124. $\overline{\text{ICAS}}$ is provided to flip-flop 312 set and reset inputs, thereby forcing ADR1 and $\overline{\text{ADR1}}$ to logic 1. ROW input to gates 314 then transfers row address bits ADR 9 to 15 through gates 314 (R0-R6) and 322 (A0-A6) to banks 300 and 302 address inputs. RAS input to gates 318 and 320, as enabled by ADR1 and $\overline{\text{ADR1}}$, then provides $\overline{\text{RAS}}$ to both bank 300 and bank 302. ROW is terminated after the occurrence of RAS. COL may then be allowed to occur but, as just described, $\overline{\text{ICAS}}$ inhibits banks 300 and 302 $\overline{\text{CAS}}$ inputs. Refresh cycle is then complete and a single row of banks 300 and 302 has been refreshed by executing a partial read cycle.

Memory 124 refresh cycle during battery back-up operation is similar to that just described, except refresh address is not provided from ALU 112. Memory control circuitry, described further below, senses an impending failure of power from computer 110 main power supply. Refresh address is transferred from ALU 112 register to counters 306 and 308 by $\overline{\text{ENBMAD}}$. Input signal $\overline{\text{PWROFF}}$ (Power Off) to gate 332 generates $\overline{\text{ICAS}}$ to inhibit CAS and WE, and to force ADR1 and $\overline{\text{ADR1}}$ to logic 1, for duration of computer 110 main power failure. Thereafter, memory control circuitry provides signal PFSTART to counters 306 and 308 during each refresh cycle (e.g., for 400 nanoseconds every 12.8 microseconds). In this mode, counters 306 and 308 operate as counters rather than registers, and refresh address is thereby incremented by PFSTART at end of each refresh cycle. During PFSTART, ROW and RAS are provided to banks 300 and 302 as described above, as are refresh address bits ADR 9 to 15. CAS and WE are again inhibited. Successive rows of memory 124 are thereby refreshed during PFSTART at each successive refresh interval.

COL input to gates 316 is preferably driven to logic 1, and input ROW to gates 314 driven to logic 0, except when executing a refresh cycle. Also, register 310, containing column address information, is preferably provided with power from computer 110 main power supply. Register 310 is thus turned off during battery back-up operation. Resisters 334 then provide logic 1 column address bits ADR 2 to 7 to gates 316 during battery back-up operation. Except during refresh cycles, therefore, gates 314 outputs are logic 1, gates 316 outputs are logic 0, and gates 322 outputs are logic 1. This reduces memory 124, MEMMUX 134, and AREG 122 power consumption during battery back-up operation when refresh cycles are not being executed.

At the conclusion of the battery back-up operation, computer 110 resumes its normal operation. Computer 110 then preferably executes a burst refresh subroutine wherein all rows of memory 124 are successively refreshed. Computer 110 then resumes normal operation refresh of memory 124 as described above.

Referring to FIG. 3B, memory control circuitry is shown. Flip-flops 336 to 344 comprise a five bit shaft register providing memory control signals ROW, RAS, COL, and CAS.

Gates 346, 348, and 350 provide a logic 1 to flip-flop 336 J input when a memory read, write, or refresh cycle is to be executed. Specifically, gate 346 provides a logic 1 when input $\overline{\text{INSTSAGEALC}}$ (Instruction, SAGE, Arithmetic and Logic Class) from SAGE 142 indicates that instruction on MEMOUT bus 136 calls for a memory read or write operation. Gate 348 provides a logic 1 when input signal $\mu$IRB27 from $\mu$IRB 164 indicates a microinstruction calling for a memory read or write cycle. Input signal $\overline{\text{TSTART}}$ (Test Start) to gate 350 initiates memory 124 read and write cycles during computer 110 test sequences. In normal operation, memory refresh cycles are initiated as a interrupt operation. A counter (not shown for clarity of presentation) provides a refresh interrupt signal every 2.8 microseconds. A corresponding microinstruction sequence provides a corresponding $\mu$IRB27 input to initiate a memory 124 refresh cycle as described above.

At the start of a memory cycle, ROW is logic 1 and COL, RAS, and CAS are logic 0. Flip-flop 336 J input is sampled by clock input 5CLK (5 MHz clock) so that flip-flop 336 Q and $\overline{\text{Q}}$ outputs provide 200 nanosecond MEMSTART and $\overline{\text{MEMSTART}}$ (Memory Start) pulses at the start of each memory cycle. Shift register flip-flops 338, 340, 342, and 344 are clocked by 40CLK (40 MHz clock) and sample flip-flop 336 MEMSTART output. Appearance of MEMSTART thereby causes a logic 1 to propagate from flip-flop 338 to flip-flop 344. RAS thereby becomes logic 1 at the first 40CLK pulse and remains so until MEMSTART returns to logic 0. Two 40CLK clock pulses later, COL becomes logic 1 and ROW becomes logic 0. CAS becomes logic 1 one 40CLK period after COL becomes logic 1. MEMSTART then terminates on next 5CLK pulse. End of MEMSTART is detected by gate 352. 10CLK (10 MHz clock) input of gate 352 samples gate 352 MEMSTART input. Gate 352 provides K inputs to flip-flops 338, 340, and 342 to insure flip-flops 338, 340, and 342 are reset (i.e., Q outputs are logic 0) at end of MEMSTART. 10CLK likewise samples $\overline{\text{ENDMEM}}$ (End Memory Cycle) input of gate 354, which provides flip-flop 344 K input. $\overline{\text{ENDMEM}}$ indicates the end of a memory cycle and insures flip-flop 344 Q output is reset to logic 0 at end of a memory cycle. Signals $\overline{\text{P}}$ (Preset) and $\overline{\text{TESTRESET}}$ to set and reset inputs of flip-flops 336, 338, 340, 344, 356, and 360 (discussed below) allow memory 124 control circuitry to be set and reset (e.g., on computer 110 start-up).

Flip-flop 356 and gate 358 comprise circuitry indicating imminent failure of computer 110 power from computer 110 main power supply. Flip-flop 356 data input signal PWROK (Power OK) from computer 110 main power supply indicates pending occurrence of such a failure. PWROK is sampled by flip-flop 356 clock input signal $\overline{\text{REFRESH}}$. REFRESH occurs at start of each normal operation refresh cycle and is provided from refresh microinstruction sequence described above. Flip-flop 356 thereby samples computer 110 main power supply condition during each normal operation refresh cycle. If PWROK indicates a main power supply failure is imminent, flip-flop 356 $\overline{\text{Q}}$ output provides PWROFF (Power Off) indicating a pending failure. PWROFF is inverted by gate 358 to provide $\overline{\text{PWROFF}}$. PWROFF and $\overline{\text{PWROFF}}$ are provided to, respectively, gates 346 and 348 to inhibit INSTSAGEALC AND $\mu$IRB27. $\overline{\text{PWROFF}}$ thereby prevents false triggering of memory cycles during battery back-up operation.

Generation of memory control signals ROW, RAS, COL, and CAS during battery back-up operation is controlled by flip-flop 360. Flip-flop 360 provides output signals PFSTART and $\overline{\text{PFSTART}}$. During normal operation, $\overline{\text{PWROFF}}$ through OR gate 362 to flip-flop 360 resets input forces $\overline{\text{PFSTART}}$ to be logic 1 and PFSTART to be logic 0. During battery back-up operation, flip-flop 360 data input MEMHIGH (Memory High, a logic 1) is sampled by flip-flop 360 clock input signal REFRQ (Refresh Request). REFRQ is provided from a clock circuit (not shown for clarity of presentation) and occurs at memory 124 refresh intervals (12.8 microseconds). Each REFRQ causes PFSTART to become logic 1 and $\overline{\text{PFSTART}}$ to become logic 0. PFSTART is provided, as described above, to address register 122 counter 306 clock input. PFSTART is provided to gate 350 input to initiate generation of memory control signals ROW and RAS during a refresh cycle. $\overline{\text{MEMSTART}}$ and ROW are connected to inputs of gate 364, which provides a flip-flop 360 reset input signal through gate 352. Gate 364 reset signal terminates PFSTART when ROW goes to logic 0 during refresh cycle; flip-flop 360 is thereby reset in preparation for next refresh cycle. $\overline{\text{PFSTART}}$ is also provided to an input of gate 366, whose output is connected to flip-flop 342 set input. During normal operation, PWROFF to gate 366 forces gate 366 output of logic 1. Flip-flop 342 may therefore operate as described above to generate memory control signals during normal operation. In battery back-up operation, $\overline{\text{PFSTART}}$ forces gate 366 output to logic 0 except during refresh cycles. Flip-flop 342 is thereby forced to set condition, with COL logic 1 and ROW logic 0. As described above, this forces MEMMUX 134 and memory 124 into reduced power state when refresh cycles are not being executed. Flip-flop 342 set input is released by $\overline{\text{PFSTART}}$ at start of a battery back-up refresh cycle. Flip-flop 342 is then reset by K input from gate 352, so that COL is logic 0-and ROW is logic 1, as required at start of refresh cycle.

Description of memory 124 and memory 124 control circuitry structure and operation is hereby completed, and computer 110 prefetch circuitry will be described next.

4. Computer 110 Pre-Fetch Circuitry (FIGS. 1, 4, and 4A)

Referring to FIG. 1, as previously discussed a sequence of macroinstructions comprising a user's program is generally stored in memory 124. CPU 114, as described further below, tracks program execution by storing memory 124 address of the instruction currently being executed by CPU 114. This address is referred to as current program count (CPC). CPC is incremented as successive macroinstructions are called from memory 124 and executed. CPC may be used during current instruction execution, e.g., to generate a memory 124 address relative to CPC. Computer 110 pre-fetch circuitry allows the next instruction to be executed by CPU 114 to be fetched from memory 124 while a current instruction is being executed. To accomplish this, ALU 112 generates and provides a next program count (NPC) representing memory 124 address of next instruction to be executed by CPU 114.

Figure 4:
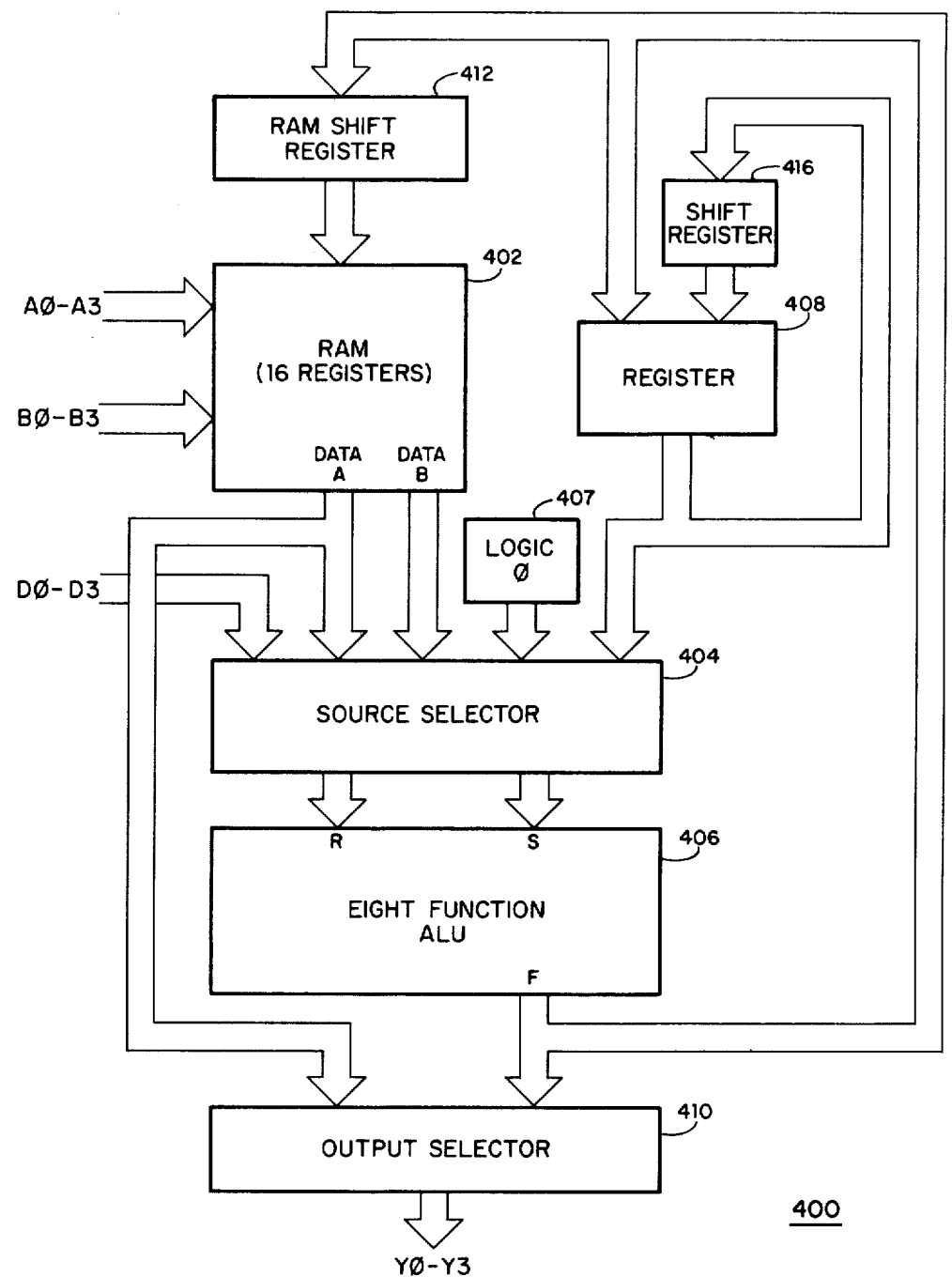
FIG. 4 is a partial block diagram of part of computer processor.
Figure 4A:
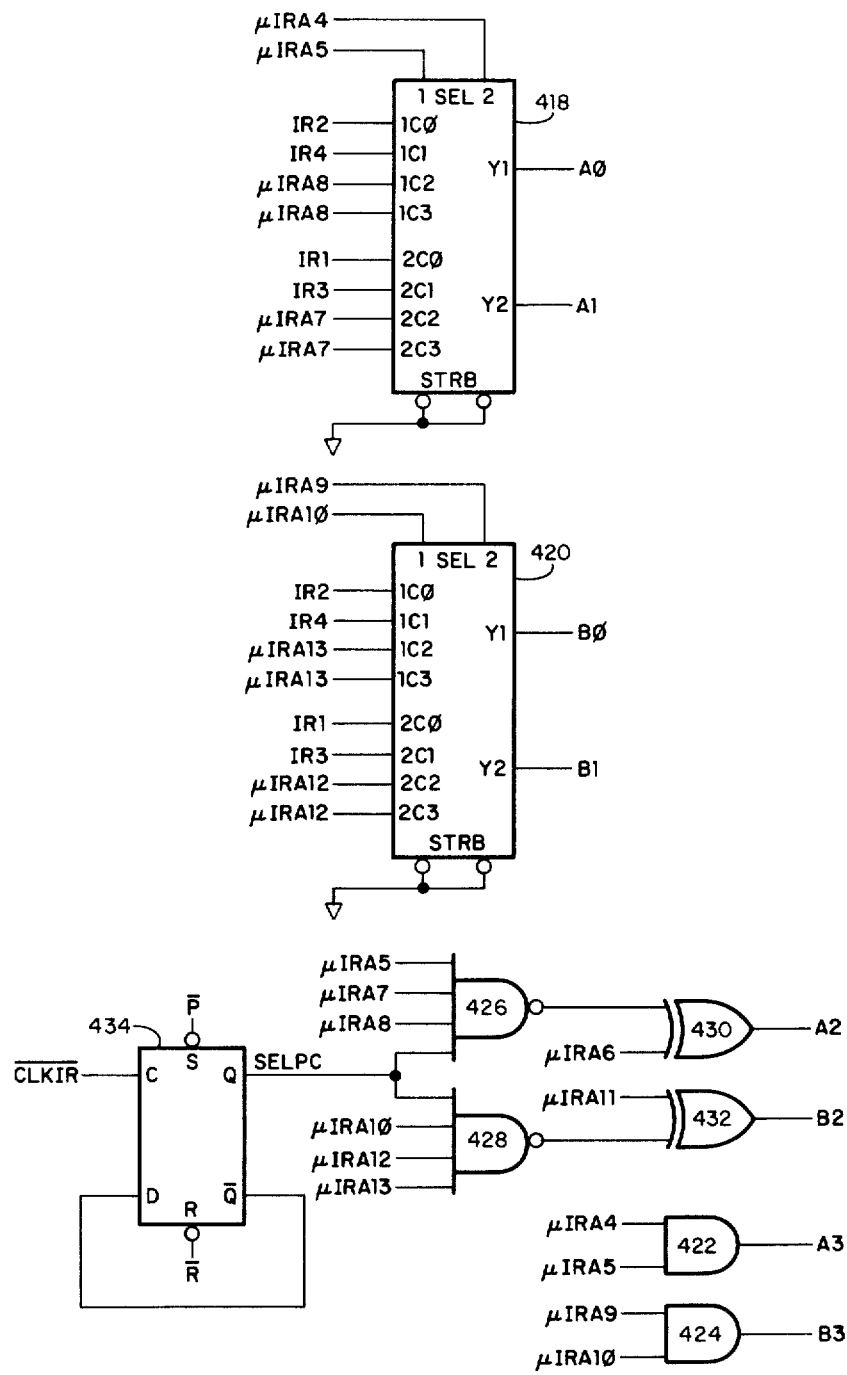
FIG. 4A is a schematic of instruction prefetch address circuitry.

Referring to FIG. 4, a partial block diagram of ALU 112 bit slice 400 is shown. Each such bit slice 400 may be capable of performing eight arithmetic and logic operations on four binary bits of information. ALU 112 may comprise four such bit slices 400 connected in parallel. Each bit slice 400 includes random access memory (RAM) 402, which comprises 16 separately addressable registers. Address inputs A0 to A3 and B0 to B3 allow any two of sixteen registers to be selected as, respectively, A and B registers. Contents of A and B registers so selected appear, respectively, at data outputs A and B. Source selector 404 may then select RAM 402 data outputs A and B, or any of three other data sources, to be connected to data inputs R and S of arithmetic and logic unit 406. Other data sources include external data input D0 to D3, Logic 0 407, and register 408 output. ALU 406 may perform any of eight possible arithmetic and logic operations on data inputs R and S to provide output F. Output selector 410 may then select either ALU 406 output F or RAM array 402 data output A to appear as bit slice 400 output Y0 to Y3. ALU 406 output F may be transferred into RAM 402 register, through RAM shift register 412, or into register 408. Register 408 output may be bit shifted, by shift register 416, and transferred back into register 408 input. Four bit slices 400 of ALU 112 thereby enable ALU 112 to perform any of eight arithmetic and logic operations on 16 binary bits of information. In particular, ALU 112 thereby contains 16 16-bit registers.

Two ALU 112 registers are dedicated to storing CPC and NPC. In operation, assuming CPC is stored in a first register and NPC in a second register, second register can be selected as register A. NPC then appears on ALUOUT bus 116. NPC may then be used to address memory 124 to cause next macroinstruction to appear on MEMOUT bus 136. Next macroinstruction is then transferred into IR 140. At start of execution of next macroinstruction, NPC becomes CPC of that next macroinstruction and a new NPC must be generated. Old NPC remains in second register to become new CPC, and is also read from second register into ALU 406 through source selector 404. Old NPC is then incremented to generate new NPC, which is transferred from ALU 406 output F to first register to be new NPC.

First and second registers thereby alternately contain NPC and CPC with each successive macroinstruction. In each case, old NPC becomes new CPC. Amount by which old NPC is incremented to generate new NPC is determined by memory 124 address of next macroinstruction. If macroinstructions are being called from sequential memory 124 addresses, each old NPC is incremented by one to generate new NPC. Old NPC may be incremented by more than one, e.g., where new memory 124 address is determined by a skip or jump, or is an indirect address.

Referring to FIG. 4A, circuitry for generating address inputs A0 to A3 and B0 to B3 to bit slices 400 of ALU 112 is shown. First and second registers are preferably selected so their addresses differ in only one bit. E.g., first register may have binary address 1011 and second register binary address 1111; their addresses differ then only in bit 2. Circuitry for selecting either of first or second registers is thereby simplified. RAM 402 address bits A0, B0, A1, B1, A3, and B3 are not a function of which of first and second registers contains NPC or CPC. These RAM 402 address inputs are therefore provided by random logic comprising multiplexors 418 and 420 and gates 422 and 424. This logic is determined by specific bits from IR 140, $\mu$IRA 162, and $\mu$IRB 164 used to address RAMs 402 of ALU 112. This logic is therefore a specific function of a particular microinstruction set and will not be discussed further; design of such logic is well known, 428, 430 and those of ordinary skill in the art. Gates 426 to 432 generate RAM 400 address bits A2 and B2 and are similarly a function of specific microinstruction set. Gates 426 and 428, however, have input signal SELPC (Select PC) which indicates whether NPC is a first or second register. As described above, either first or second register may be selected as register A or register B. When first or second register is so selected, SELPC determines whether register address bit 2 is one or zero. SELPC is provided from flip-flop 434 Q output. Flip-flop 434 $\bar{Q}$ output is connected to flip-flop 434 data input, so that SELPC is alternately one and 0 as flip-flop 434 is clocked by input signal $\overline{CLKIR}$ (Clock Instruction Register). CLKIR is a clock signal to IR 140 to load macroinstructions from MEMOUT bus 136 into IR 140. SELPC therefore alternates between logic 1 and logic 0 as successive macroinstructions are loaded into IR 140. SELPC then represents whether NPC, which is alternately present in first and second registers, is in first register or second register.

Discussion of computer 110 pre-fetch circuitry structure and operation is hereby concluded. Having described structure and operation of microinstruction logic 144, memory 124 and memory 124 control circuitry, and computer 110 pre-fetch circuitry, certain features of computer 110 will be summarized next.

5. Summary Of Computer 110 Features

Certain features of computer 110, which features and others were described above, are:

. First, division of microinstructions into microinstruction segments, storage of such segments in microinstruction memory 160, provision of a separate microinstruction register for each such segment of a microinstruction, and sequential transfer of microinstruction segments into a microinstruction registers to effectively assemble a complete microinstruction. Microinstructions may thereby be efficiently packed into microinstruction memory 160 physical structure by time multiplexing memory 160 physical address space. Microinstruction organization is thereby tailored to match memory 160 physical structure. In general, each microinstruction may be divided into an integer number N of microinstruction segments. The width of each segment is equal to or less than the width of a single memory 160 storage location. Memory 160 length is preferably at least N times the number of microinstructions to be stored therein. Microinstruction segments are preferably stored in memory 160 in a predetermined order to simplify addressing. There may be a separate microinstruction register for each segment of a microinstruction. Individual segments comprising a microinstruction are time sequentially transferred from memory 160 to microinstruction registers in predetermined order. Transfer of microinstruction segments may preferably be performed within a single CPU cycle; memory 160 access time is therefore preferably less than 1/N times CPU cycle period.

Second, use of certain microinstruction segments to provide control signals for selecting successive microinstructions of a microinstruction sequence. This simplifies circuitry required for selecting successive microinstructions. The time required to select successive microinstructions is thereby reduced. This allows greater flexibility in organizing memory 160 and microinstructions, as described above, and increases the speed of microinstruction execution.

Third, the use of dual mode (counters/registers) storage devices in address register (AREG) 122. Generation of memory 124 refresh addresses may thereby be transferred from ALU 112 to AREG 122 when computer 110 enters battery back-up operation. This simplifies circuitry required to maintain memory 124 refresh during battery back-up operation.

A fourth feature is use of dual ALU 112 registers to concurrently store a current program count (CPC) and a next program count (NPC). A next instruction to be executed may thereby be fetched from memory 124 by NPC, while CPC may be used in executing a current instruction. The time required to execute successive instructions is thereby reduced and the circuitry required to perform instruction pre-fetch is simplified.

Description of a preferred embodiment of the present invention is hereby concluded. The invention may be embodied in yet other specific forms without departing from the spirit or essential characteristics thereof. E.g., microinstruction memory 160 may vary in length and width and may have other internal organizations. For example, memory 160 may be twelve bits wide and 1,024 words long and organized as a single page memory. Similarly, each microinstruction may contain, e.g., 56 or 16 bits, and may be differently segmented. Segments of a single microinstruction need not be stored in successive memory 160 locations but, for example, may be stored therein in an interleaved manner. Likewise, memory 124 may be of different capacity and may be differently organized and addressed. Memory 124 may use different control signals and sequences than those shown herein, and other arrangements of memory address register 122 may be used. Further, pre-fetch registers for storing current and new program counts may be separate from, rather than part of, ALU 112. Likewise, incrementing of NPC and CPC may be performed by circuitry other than bit slices 400 of ALU 112. Thus, the present embodiments are to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. A digital computer system including processor means for processing digital data; microinstruction logic means for providing sequences of microinstructions for controlling said processor means; memory means for storing at least macroinstructions employed in controlling said system; and memory output bus means for conducting said at least macroinstructions from said memory means to said microinstruction logic means; said microinstruction logic means comprising:

means for receiving and storing first certain ones of said macroinstructions for selecting operations to be performed by said processor means, each one of said first certain ones of said macroinstructions corresponding to an associated one of said sequences of microinstructions for controlling said processor means;

microinstruction memory means for segmentally storing each microinstruction of each one of said sequence of microinstructions, wherein each said microinstruction is divided into a plurality of segments and each one of said segments is stored in a separate location in said microinstruction memory means, decoding means responsive to each one of said first certain ones of said macroinstructions for sequentially selecting each one of said segments of said each one of said microinstructions of said corresponding sequences of microinstructions; and means connected from said microinstruction memory means and responsive to operation of said decoding and selecting means for (1) sequentially receiving and storing said each one of said segments of said corresponding each one of said microinstructions, and (2) providing said corresponding sequences of microinstructions for controlling said processor means.

2. The computer system of claim 1 wherein said each microinstruction of said each one of said sequences of microinstructions comprises N microinstruction segments where N is greater than 1, and each one of said segments comprises n binary bits of information, and said microinstruction memory means for segmentally storing said segments of said microinstructions comprises a plurality of separately selectable storage locations, each one of said storage locations capable of storing n binary bits of information.

3. The computer system of claims 1 or 2 wherein said decoding and selecting means further comprises SAGE means coupled from said memory output bus means and to said microinstruction memory means and responsive to second certain ones of said first certain ones of said macroinstructions for directly selecting the first microinstruction of each sequence of said microinstructions corresponding to each one of said second certain ones of said first ones certain of said macroinstructions.

4. The computer system of claims 1 or 2 wherein certain ones of said segments of said each said microinstruction of said each one of said sequences of microinstructions contain information for selecting a successive said microinstruction, and said selecting means includes means responsive to said ones of said segments for selecting each said successive said microinstruction.

5. In a digital computer system including processor means for processing digital data and memory means for storing at least macroinstructions employed to select operations to be performed by said processor means, microinstruction logic means for controlling said processor means, comprising:

microinstruction memory means for segmentally storing sequences of microinstruction for controlling said processor means, at least one of said sequences of microinstructions being associated with each one of said macroinstructions, wherein each microinstruction of each one of said sequences of microinstructions is divided into a plurality of segments and each one of said segments is stored in a separate location in said microinstruction memory means, and means responsive to said each one of said macroinstructions for sequentially selecting each one of said segments of said each microinstruction of said sequences of microinstructions associated with said each one of said macroinstructions; and means connected from said sequential selecting means for (1) sequentially receiving and storing said each one of said segments of said each microinstruction, and (2) providing said sequences of microinstructions for controlling said processor means to perform said operations selected by said macroinstructions.

* * * * *